US010430540B1

(12) United States Patent
Van Campenhout

(10) Patent No.: US 10,430,540 B1
(45) Date of Patent: Oct. 1, 2019

(54) PROCESSING A BLOCK DIAGRAM CIRCUIT DESIGN INTO AN EFFICIENT HIGH-LEVEL LANGUAGE REPRESENTATION

(71) Applicant: Xilinx, Inc., San Jose, CA (US)

(72) Inventor: David Van Campenhout, San Jose, CA (US)

(73) Assignee: XILINX, INC., San Jose, CA (US)

( * ) Notice: Subject to any disclaimer, the term of this patent is extended or adjusted under 35 U.S.C. 154(b) by 58 days.

(21) Appl. No.: 15/880,429

(22) Filed: Jan. 25, 2018

(51) Int. Cl.
*G06F 17/50* (2006.01)
*G06F 8/41* (2018.01)

(52) U.S. Cl.
CPC ............ *G06F 17/505* (2013.01); *G06F 8/452* (2013.01)

(58) Field of Classification Search
CPC .................................................... G06F 17/505
USPC ........................................................ 716/102
See application file for complete search history.

(56) References Cited

U.S. PATENT DOCUMENTS

| | | | |
|---|---|---|---|
| 7,315,991 B1 * | 1/2008 | Bennett | G06F 17/5045 716/103 |
| 7,657,419 B2 * | 2/2010 | van der Made | G06F 9/45537 703/22 |
| 8,473,880 B1 * | 6/2013 | Bennett | G06F 17/505 716/104 |
| 8,762,916 B1 * | 6/2014 | Kathail | G06F 17/5054 326/37 |
| 9,378,003 B1 * | 6/2016 | Sundararajan | G06F 8/4441 |
| 2005/0204316 A1 * | 9/2005 | Nebel | G06F 17/5022 716/103 |

* cited by examiner

*Primary Examiner* — Suresh Memula
(74) *Attorney, Agent, or Firm* — LeRoy D. Maunu

(57) ABSTRACT

Disclosed approaches include inputting a block diagram representation of a circuit design to a processor. Respective high-level programming language (HLL) code fragments associated with each block of the block diagram representation are determined. A dependency graph is generated from the block diagram representation. One or more clusters of vertices are generated from the dependency graph. Each of the HLL code fragments represented by the vertices of each cluster includes a for-loop, and each cluster includes a subset of the plurality of vertices and edges. For each of the clusters, a plurality of for-loops of the HLL code fragments associated with blocks represented by the vertices of the cluster are combined into a single for-loop. An HLL function is generated from each single for-loop and the HLL code fragments associated with each block that is not represented by any of the one or more clusters.

20 Claims, 7 Drawing Sheets

PROCESSING A BLOCK DIAGRAM CIRCUIT DESIGN INTO AN EFFICIENT HIGH-LEVEL LANGUAGE REPRESENTATION

TECHNICAL FIELD

The disclosure generally relates to processing of block diagram circuit designs

BACKGROUND

One design flow for creating a circuit design and implementing a circuit involves entering the initial design via a block diagramming environment such as the SIMULINK® environment. After the initial circuit design is specified as a block diagram, functionally equivalent high-level programming language (HLL) code (e.g., C++ code) can be generated. The C++ code can then be synthesized into a hardware specification, such as a configuration bitstream targeted to a field programmable gate array (FPGA) using a high-level synthesis (HLS) tool.

The generated HLL code generally consists of a function that computes a sample of the output ports of the block diagram as a function of the samples of the input ports of the block diagram. The function may be composed from HLL code fragments that implement each of the blocks of the block diagram. For some applications, such as image and video processing, directives are included in the HLL code to promote a streaming and pipelined architecture. Thus, each block from the original block diagram can be translated into an individual task of a pipelined circuit.

The generated HLL code may fail to deliver a quality-of-result (QoR) in the resulting circuit comparable to the QoR achievable from hand-written HLL code. The QoR can be quantified using factors such as the maximum clock frequency, at which the resulting circuit can operate correctly, the resource utilization of circuitry on a target device (e.g., an FPGA), latency of a circuit, and/or throughput of a circuit. When tasks as represented by code fragments in the HLL code correspond to blocks in the block diagram, the HLS optimizes each task individually. If the complexity of each task is low, the QoR may be inferior to the QoR that can be achieved from fewer, more complex, tasks that a designer might have hand coded.

SUMMARY

A disclosed method includes inputting a block diagram representation of a circuit design to a computer processor. The method determines, by the computer processor, respective high-level programming language (HLL) code fragments associated with each block of the block diagram representation. The method generates, by the computer processor, a dependency graph from the block diagram representation. The dependency graph includes a plurality of vertices connected by edges, each vertex representing a block of the block diagram representation, and each edge representing a signal that is driven by one block to another block. The method generates, by the computer processor, one or more clusters of vertices from the dependency graph. Each of the HLL code fragments represented by the vertices of each cluster includes a for-loop, and each cluster includes a subset of the plurality of vertices and edges. The method combines, by the computer processor and for each of the clusters, a plurality of for-loops of the HLL code fragments associated with blocks represented by the vertices of the cluster, into a single for-loop. The method generates, by the computer processor, an HLL function from each single for-loop and the HLL code fragments associated with each block that is not represented by any of the one or more clusters.

A disclosed system includes a processor and a memory coupled to the processor. The memory is configured with instructions that when executed by the processor cause the processor to perform operations including inputting a block diagram representation of a circuit design to a computer processor. The system determines respective high-level programming language (HLL) code fragments associated with each block of the block diagram representation. The system generates a dependency graph from the block diagram representation. The dependency graph includes a plurality of vertices connected by edges, each vertex representing a block of the block diagram representation, and each edge representing a signal that is driven by one block to another block. The system generates one or more clusters of vertices from the dependency graph. Each of the HLL code fragments represented by the vertices of each cluster includes a for-loop, and each cluster includes a subset of the plurality of vertices and edges. The system combines, for each of the clusters, a plurality of for-loops of the HLL code fragments associated with blocks represented by the vertices of the cluster, into a single for-loop. The system generates an HLL function from each single for-loop and the HLL code fragments associated with each block that is not represented by any of the one or more clusters.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
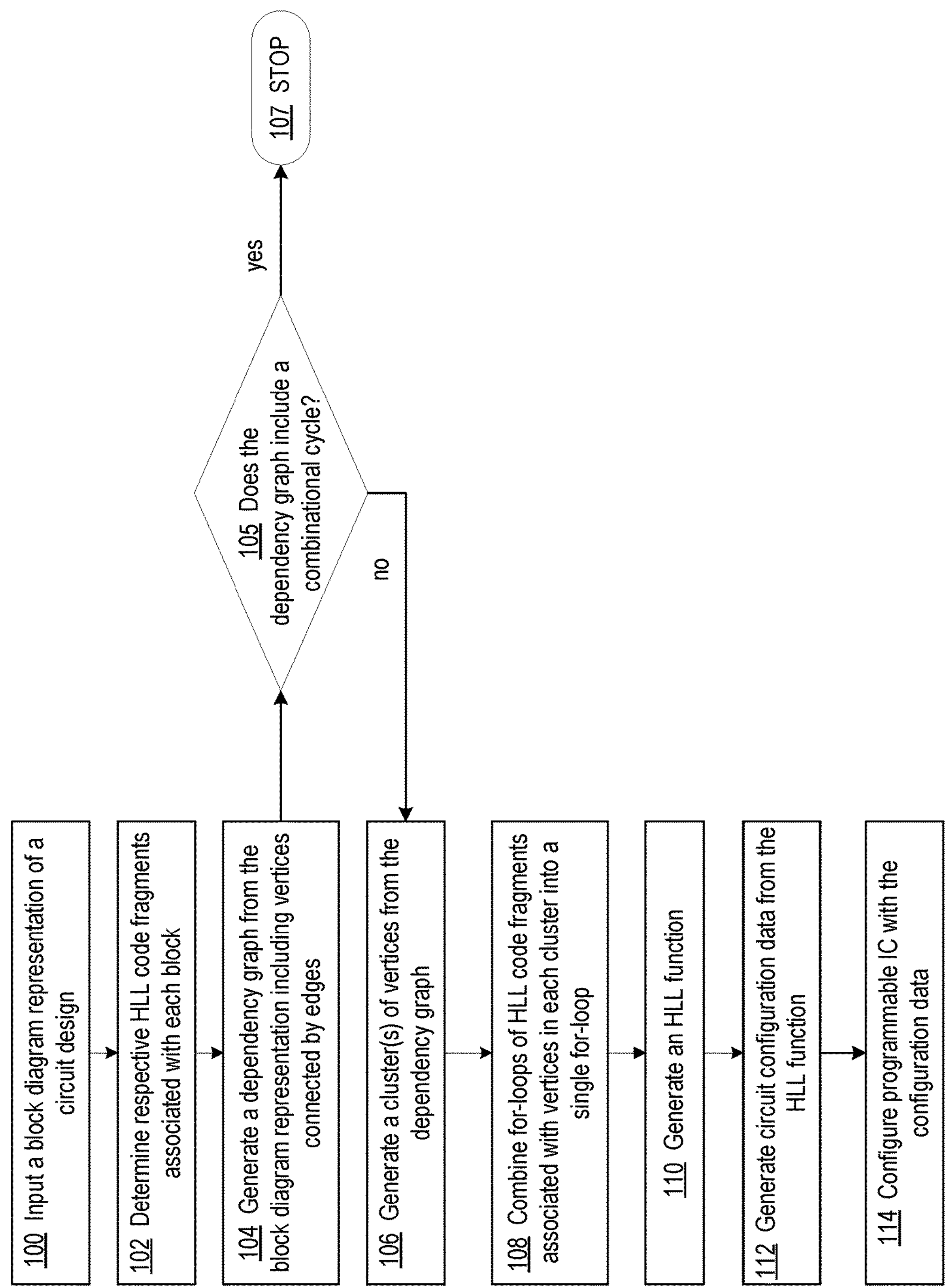
FIG. 1 shows a flowchart of an exemplary process for generating an HLL function from a clustered dependency graph.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems provide improved approaches for generating HLL code from a block diagram circuit design. The disclosed approaches improve the generated HLL code so that the implementation produced by the HLS tool has greater QoR as compared to prior approaches. The disclosed approaches provide automated methods and systems that generate a representation of the block diagram such that each block is represented by a vertex in the graph, and a pair of vertices in the graph is connected by an edge if one of the blocks represented by the vertices outputs a signal to the other block. The graph is partitioned into groups of vertices. The vertices in a group can be referred to as a cluster. HLL code is generated for each cluster consistent with the functionality of the individual HLL code fragments associated with each block of the group. In an exemplary application, each code fragment associated with a block that is represented by a vertex in a cluster can contain a for-loop, and the generated HLL code has a single for-loop that is functionally equivalent to the individual for-loops. The generated HLL code is a functional and synthesizable model for the block diagram as a whole.

The circuit generated using the process of clustering vertices requires fewer circuit resources than would a circuit generated without clustering, because the overhead incurred by the circuitry implementing the single for-loop is less than the overhead incurred by circuitry implementing individual for-loops, and buffers (e.g., first-in-first-out (FIFO) buffers) are unnecessary for signals between blocks of logic consolidated within a cluster. The disclosed approaches further improve the generated circuitry by reducing the number of tasks having multiple consumers, because a single task results from each cluster instead of one task per block as in prior approaches. Because the HLS tool optimizes each group and/or cluster rather than each block individually, the QoR is increased.

Figure 2:
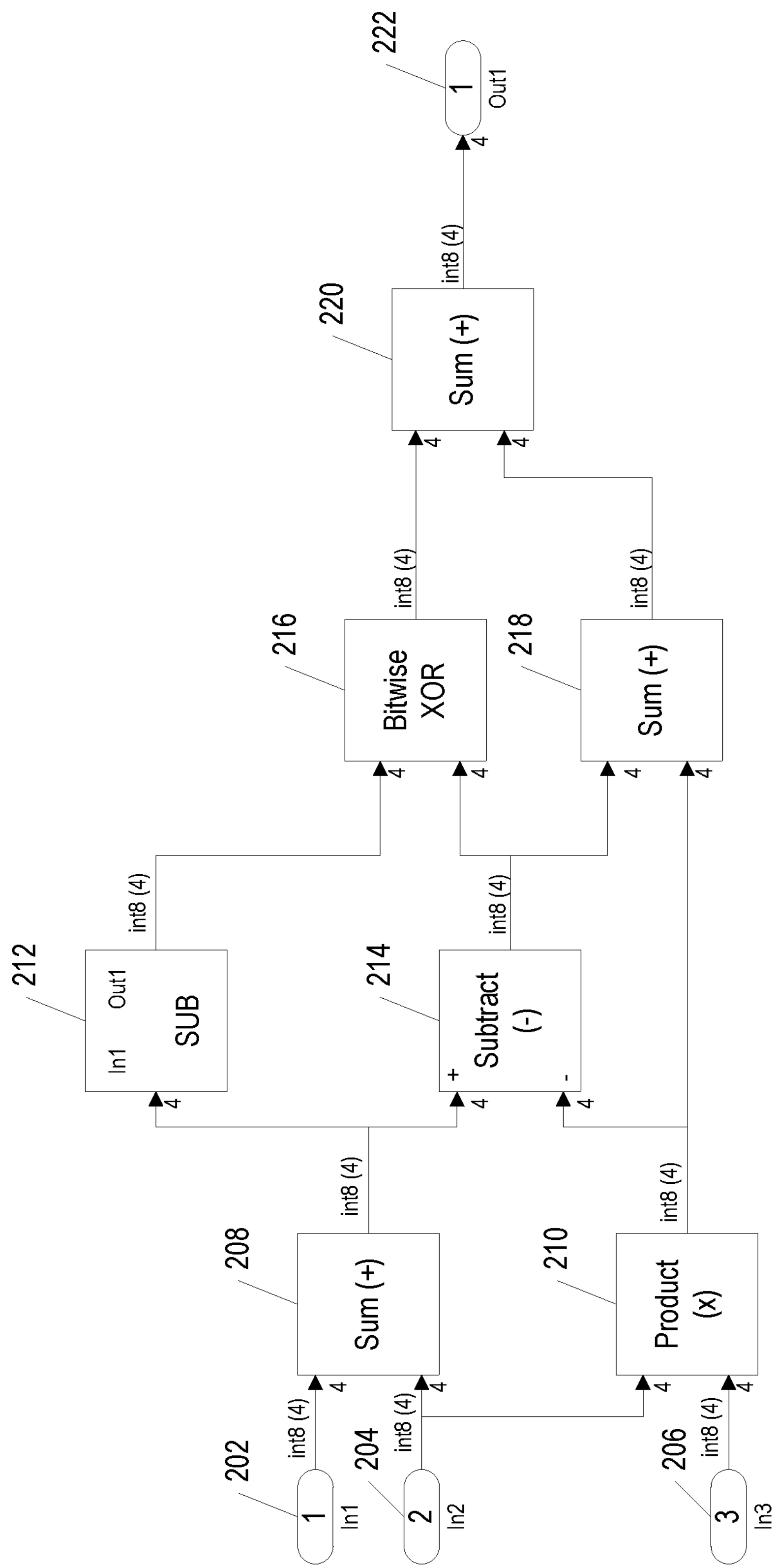
FIG. 2 shows a block diagram of an exemplary circuit design.

FIG. 1 shows a flowchart of an exemplary process for generating an HLL function from a clustered dependency graph. The following description of FIG. 1 intersperses descriptions of FIGS. 2-6 as they pertain to the steps of the process. At block 100, the system inputs a block diagram representation of a circuit design. FIG. 2 shows a block diagram of an exemplary circuit design. The block diagram includes seven blocks: a first addition block 208, multiplication block 210, 'SUB' block 212, subtraction block 214, bitwise exclusive OR (XOR) block 216, a second addition block 218, and a third addition block 220. 'SUB' block 212 represents one or more blocks of a function named 'SUB.' The block diagram is hierarchical and operates on vectors of length four. The operations are performed on the vectors in an element-wise application pattern. As used herein, "element-wise application pattern" refers to an $i^{th}$ element of an output of a block being a function of only an $i^{th}$ element of an input of the block. For example, the HLL code fragment for multiplication block 210 operates on two vectors of length four and includes a for-loop that computes the product of one element from each of the two vectors per iteration. The inputs to the block diagram are inputs 202, 204, and 206, and the output of the block diagram is output 222.

Figure 3:
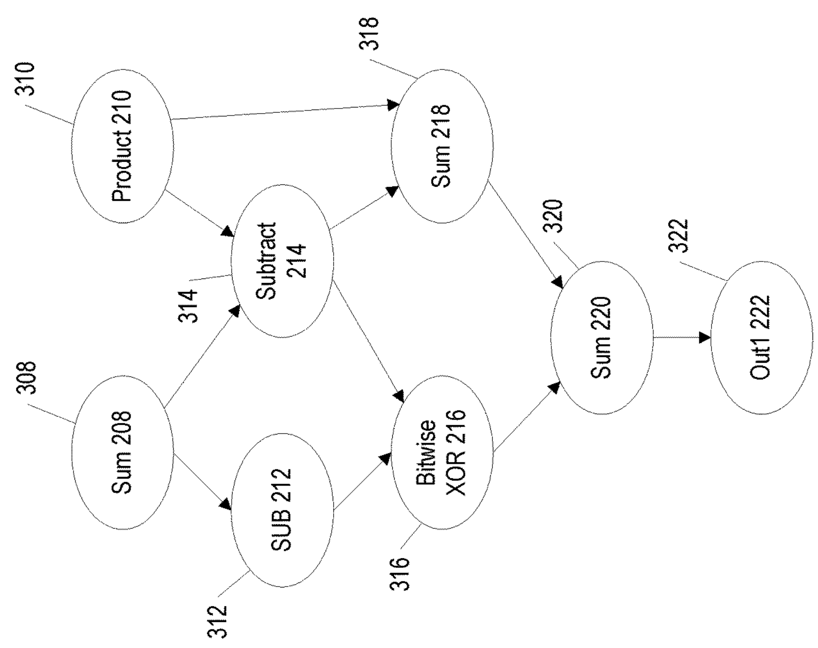
FIG. 3 shows a dependency graph of the block diagram of FIG. 2.

At block 102, the system determines respective HLL code fragments associated with each block of the block diagram. An electronic design automation (EDA) tool can include a library that includes HLL code fragments and associations with functional blocks of circuitry. For each block in the block diagram, the EDA tool can look-up the code fragment associated with the block in the library. At block 104, the system generates from the block diagram a dependency graph that includes vertices connected by edges. The code fragments determined for the blocks of the block diagram are thereby also associated with the vertices in the dependency graph. FIG. 3 shows a dependency graph generated from the block diagram of FIG. 2. Each of the vertices 308, 310, 312, 314, 316, and 318 corresponds to a block of the block diagram. Vertex 322 corresponds to output 222 of the block diagram. The dependency graph includes an edge from a first vertex to a second vertex if there is a signal in the block diagram that is driven by the block represented by the first vertex and for which the block represented by the second vertex is a sink. For example, the third addition block 220 is a sink for a signal from bitwise XOR block 216 and a signal from the second addition block 218. Accordingly, the dependency graph includes an edge connecting vertex 316 to vertex 320 and another edge connecting vertex 318 to vertex 320.

The dependency graph takes into account whether the output(s) of a block depends only on the internal state of the block or whether the output(s) is a function of the input(s) of the block. A block in which the output depends on only on the internal state and not on the values of any inputs will be represented by a vertex having no input edges. A cycle in the dependency graph indicates a combinational cycle in the block diagram, and valid HLL code cannot be generated for parts of a block diagram that include a combinational cycle.

The HLL code generated by EDA tools that do not implement the approaches described herein from the dependency graph shown in FIG. 3 is shown in Example 1 as follows:

```
void
DUT(int8_t In1[4], int8_t In2[4], int8_t In3[4], int8_t
  Out1[4])
{
  int8_t Sum_out0[4];
  int8_t Product_out0[4];
  int8_t Out1_0[4];
  int8_t Subtract_out0[4];
  int8_t Bitwise_Xor_out0[4];
  int8_t Sum1_out0[4];
  int8_t Sum2_out0[4];
  for (uint32_t k0=0; k0<4; ++k0) {
    Sum_out0[k0]=In1[k0]+In2[k0];
  }
  for (uint32_t k0=0; k0<4; ++k0) {
    Product_out0[k0]=In2[k0]*In3[k0];
  }
  SUB(Sum_out0, Out1_0);
  for (uint32_t k0=0; k0<4; ++k0) {
    Subtract_out0[k0]=Sum_out0[k0]-Product_out0
      [k0];
  }
  for (uint32_t k0=0; k0<4; ++k0) {
    Bitwise_Xor_out0[k0]=Out1_0[k0]^Subtract_out0
      [k0];
  }
  for (uint32_t k0=0; k0<4; ++k0) {
    Sum1_out0[k0]=Subtract_out0[k0]+Product_out0
      [k0];
  }
  for (uint32_t k0=0; k0<4; ++k0) {
    Sum2_out0[k0]=Bitwise_Xor_out0[k0]+
      Sum1_out0[k0];
  }
  for (uint32_t k0=0; k0<4; ++k0) {
    Out1[k0]=Sum2_out0[k0];
  }
}
```

Example 1

Note that the generated HLL code includes multiple for-loops corresponding to the first addition block 208, multiplication block 210, subtraction block 214, bitwise XOR block 216, second addition block 218, and third addition block 220. Without the approaches described herein, the EDA tool would proceed to generate a pipeline of individual sub-circuits corresponding to the for-loops. The generated pipeline sub-circuits can be much less efficient in terms or processing efficiency and IC resource usage than an implementation in which instead of multiple, individual for-loops, a single, functionally equivalent for-loop is used to generate a sub-circuit. According to the disclosed approaches, the circuit designer need not manually write HLL code to achieve such optimizations. Rather, the disclosed approaches automatically generate optimized HLL code from which improved circuitry can be generated.

Returning, now to FIG. 1, at decision block 105 the EDA tool determines whether the dependency graph includes a cycle. A cycle in the dependency graph indicates a combinational cycle in the corresponding block diagram. A dependency graph expresses combinational dependencies. Thus, any cycle in the dependency graph is a manifestation of a combinational cycle in the block diagram. In contrast, a cycle in the block diagram is a combinational cycle only if all the blocks in that cycle are combinational. Whether a block is a combinational block depends on how the value of the outputs of the block behave as a function of values at the inputs and the internal state, while the block diagram is simulated in a discrete event simulation environment. A block is combinational if the value of one of its outputs at the current time is a function of any the values of its inputs at the current time. In contrast, a block is purely sequential if the values of none of its outputs at the current time is a function of the values of any of its inputs at the current time. For sequential blocks, the values of its outputs at the current time depend not on the values of the inputs at the current time, but on the values of the internal state of the block at the current time. The value of the internal state of a sequential block at the current time is a function of the values of the internal state at the previous time and the values of the inputs at the previous time. Thus, a cycle in the original block diagram is combinational if all the blocks in the cycle are combinational. A cycle containing at least one sequential block is not a combinational cycle because the outputs of the sequential block have no combinational dependency on its inputs.

When a cycle exists in the dependency graph, HLL code that is functionally equivalent to the original block diagram cannot be generated from the code fragments associated with the individual blocks. If the EDA tool determines that a cycles is present in the dependency graph, then the process stops at block 107. If the system determines that the dependency graph does not include a cycle, the EDA tool continues at block 106.

At block 106, the system generates one or more clusters of vertices from the dependency graph. Each cluster can include two or more vertices in the dependency graph. The following constraints limit which vertices can be included in a cluster. In order for a vertex to be included in a cluster, the HLL code fragment associated with the vertex must include a for-loop or a nest of for-loops. Also, each for-loop associated with a respective block must generate the output(s) only as a function of the input(s) of the block following an element-wise application pattern. The blocks corresponding to all vertices in a cluster must operate on non-scalar data of the same dimensions. For example, vertices can be clustered if the associated blocks operate on vectors of the same length or matrices with the same number of rows and columns. A group of vertices cannot be clustered if the cluster would introduce a cycle in the dependency graph.

Figure 4:
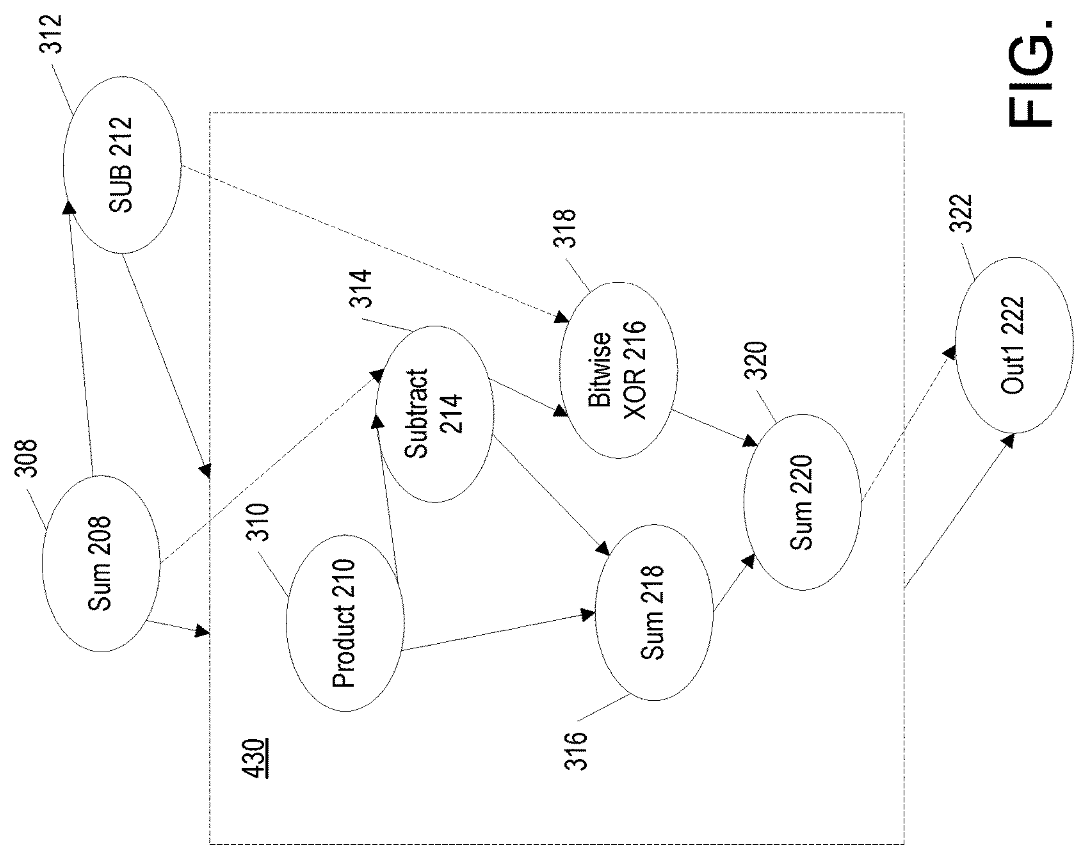
FIG. 4 shows a clustered dependency graph generated from the dependency graph of FIG. 3.

FIG. 4 shows a clustered dependency graph generated from the dependency graph of FIG. 3. The clustered dependency graph is generated by selecting one of the vertices of the dependency graph and determining if another vertex connected to that vertex satisfies cluster constraint(s). For example, an EDA tool selects vertex 310 and determines whether vertex 314, which is connected to vertex 310, satisfies the cluster constraints. The EDA tool determines that blocks 210 and 214, which correspond to vertices 310 and 314, operate on non-scalar data of the same length (FIG. 2, vectors of length four) and follow an element-wise application pattern (as indicated by the corresponding code fragments). The EDA tool also determines that including vertices 310 and 314 in a cluster would not introduce a cycle in the dependency graph. Thus, vertices 310 and 314 can be included in cluster 430 (represented by the dashed box). In at least one implementation, the system performs the determination on the remaining pairs of connected vertices: vertices 308 and 314, vertices 312 and 318, vertices 310 and 316, vertices 314 and 316, vertices 314 and 318, vertices 316 and 320, and vertices 318 and 320.

In FIG. 3, vertices 310, 314, 316, 318, and 320, which represent blocks 210, 214, 216, 218, and 220 shown in FIG. 2, respectively, satisfy the cluster constraint(s). Vertex 312 represents 'SUB' block 212 and cannot be included in a cluster because 'SUB' block 212 represents a function that does not follow an element-wise application pattern. Vertex 308 represents the first addition block 208 and cannot be included in the cluster 430 because including vertex 308 would introduce a combinational cycle in the clustered dependency graph. 'SUB' block 212 is driven by the first addition block 208 and drives bitwise XOR block 216. As a result, including the vertex 308 would introduce a combinational cycle from the cluster to vertex 312 (vertex 308 in the cluster to vertex 312) and from vertex 312 to the cluster (vertex 312 to vertex 318 in the cluster).

Figure 5:
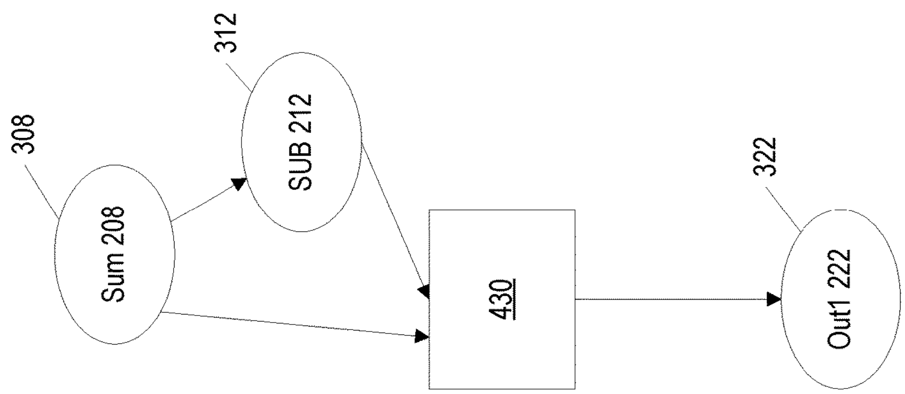
FIG. 5 shows a clustered dependency graph generated from the dependency graph of FIG. 3.

After determining which vertices can be clustered, generating the clustered dependency graph includes removing from the dependency graph the edges connecting the clustered vertices to non-clustered vertices (represented by the dashed arrows). Dashed box 430 encompasses the vertices of the cluster. Edges are added connecting cluster 430 to vertex 308, vertex 312, and output vertex 322, respectively. FIG. 4 shows the vertices within cluster 430 for illustrative purposes. In FIG. 5, the vertices 310, 314, 316, 318, and 320 included in the cluster shown in FIG. 4 are replaced with vertex 430. FIG. 5 shows a clustered dependency graph generated from the dependency graph of FIG. 3. The edges that previously connected vertex 308 to vertex 314, vertex 312 to vertex 318, and vertex 320 to vertex 322 are replaced with edges from vertices 308 and 312 to vertex 430 and from vertex 430 to vertex 322.

In at least one implementation, generating the clustered dependency graph of FIG. 5 can be analogized to one vertex absorbing into another vertex. For example, beginning with the dependency graph shown in FIG. 3, in response to the system determining that vertex 314, which is connected to vertex 310, satisfies the cluster constraints, the edges connecting vertex 310 to vertex 314, vertex 314 to vertex 316, and vertex 314 to vertex 318 are excluded from the clustered dependency graph, vertex 314 is excluded from the clustered dependency graph, and an edge connecting vertex 310 to vertex 316 is added to the clustered dependency graph. Because vertex 310 is already connected to vertex 316, an edge connecting vertex 310 to vertex 316 is not added. After excluding and adding edges, the system determines whether the remaining vertices satisfy the cluster constraint(s). When the system determines that a second vertex connected to vertex 310 (a first vertex) satisfies the cluster constraint(s), the second vertex is "absorbed" into vertex 310. That is, the second vertex is excluded from the clustered dependency graph; the edge connecting vertex 310 to the second vertex is excluded from the clustered dependency graph; each edge connecting the second vertex to other vertices are excluded from the clustered dependency graph; and an edge connecting vertex 310 to the other vertices are added, if vertex 310 is not already connected to the other vertices. The result is the clustered dependency graph shown in FIG. 5 where vertex 430 analogous to vertex 310 having "absorbed" vertices 314, 316, 318, and 320.

Clustering can be tailored to achieve various objectives. For example, the quantity of vertices per cluster can be maximized. That is, a single cluster can include as many vertices representing blocks of a block diagram as possible. Non-scalar signals in the block diagram driven by multiple blocks require additional logic to allow the elements of these signals to be read independently. The associated overhead can be reduced by tailoring the clustering to include vertices that represent blocks that are sinks of the same non-scalar signal in the same cluster. For larger block diagrams, the clustering can be tailored to reduce the runtime of generating the clusters. For example, multiple clusters including a few vertices can be generated.

Returning, now to FIG. 1, at block 108, the system combines the for-loops of the HLL code fragments associated with the vertices in each cluster into a cluster function having a single for-loop. In combining the multiple for-loops into a single for-loop, the EDA tool sorts the vertices of the cluster dependency graph in topological order and then sorts the vertices of each cluster in topological order. In sorting the vertices of a cluster, the EDA tool begins with a vertex of the cluster that represents a block that is directly driven by an input of the cluster. In generating the single for-loop, the EDA tool declares in an HLL function, scalar variables that correspond to non-scalar signals between blocks represented by vertices of the cluster. In addition, the EDA tool specifies in the single for-loop, HLL statements that operate on the scalar variables. The specified HLL statements are specified in an order corresponding to the topological order of the vertices in the cluster, and in the single for-loop provide equivalent functionality to the multiple for-loops corresponding to the vertices in the cluster.

At block 110, the system generates a complete HLL function from the dependency graph. The HLL complete function includes the each single for-loop generated from each cluster and HLL code fragments associated with vertices that are not associated with any cluster. In generating the complete HLL function, the EDA tool declares arguments to the HLL function. The arguments correspond to the input(s) and output(s) of the block diagram. In addition, the EDA tool specifies in the HLL function the code fragments associated with each block that is not represented by a vertex in a cluster. The order of the code fragments and single for-loop(s), which corresponds to a cluster(s), corresponds to the topological sort order of the dependency graph. The HLL complete function generated from the clustered dependency graphs shown in FIGS. 4 and 5 is shown in Example 2 as follows:

```
void
DUT(int8_t In1[4], int8_t In2[4], int8_t In3[4], int8_t
  Out1[4])
{
  int8_t Sum_out0[4];
  int8_t Out1_0[4];
  int8_t Sum2_out0[4];
  for (uint32_t k0=0; k0<4; ++k0) {
    Sum_out0[k0]=In1[k0]+In2[k0];
  }
  SUB(Sum_out0, Out1_0);
  for (uint32_t k0=0; k0<4; ++k0) {
    int8_t In2_c8;
    int8_t In3_c8;
    int8_t Sum_out_c8;
    int8_t Out1_c8;
    int8_t Product_out_c8;
    int8_t Subtract_out_c8;
    int8_t Bitwise_Xor_out_c8;
    int8_t Sum1_out_c8;
    int8_t Sum2_out_c8;
    In2_c8=In2[k0];
    In3_c8=In3[k0];
    Sum_out_c8=Sum_out0[k0];
    Out1_c8=Out1_0[k0];
    Product_out_c8=In2_c8*In3_c8;
    Subtract_out_c8=Sum_out_c8-Product_out_c8;
    Bitwise_Xor_out_c8=Out1_c8 Subtract_out_c8;
    Sum1_out_c8=Subtract_out_c8+Product_out_c8;
    Sum2_out_c8=Bitwise_Xor_out_c8+Sum1_out_c8;
    Sum2_out0[k0]=Sum2_out_c8;
  }
  for (uint32_t k0=0; k0<4; ++k0) {
    Out1[k0]=Sum2_out0[k0];
  }
}
```

Example 2

The HLL function includes a for-loop separate from the single for-loop corresponding to the clustered vertices for the first addition block 208 because vertex 308 was not included in the cluster of vertices. The separate for-loop is specified in Example 2 as:

```
for (uint32_t k0=0; k0<4; ++k0) {
  Sum_out0[k0]=In1[k0]+In2[k0];
```

The HLL code fragment (SUB(Sum_out0, Out1_0) in Example 2) represented by vertex 312 is not included in the single for-loop corresponding to the cluster because 'SUB' block 212 does not follow an element-wise application pattern. The HLL function of Example 2 includes a single for-loop for the cluster of vertices. Whereas the original HLL code in Example 1 included seven for-loops, the HLL function of Example 2 only has three for-loops. The array variables included in the original HLL code of Example 1 that are associated with the clustered vertices are replaced with scalar variables in the HLL function of Example 2. In the original HLL code, the array variables are declared at the beginning to be used with each of the for-loops. In contrast, in the HLL function of Example 2, scalar variables are declared within the single for-loop.

Clustering improves the QoR of the resulting circuit by reducing the number of non-scalar signals and reducing the number of for-loops, and/or allowing the HLS tool to optimize larger segments of code. The resulting circuit uses fewer resources and achieves better latency and throughput as compared to a circuit obtained without clustering. Previously, non-scalar data connecting blocks may be implemented as FIFO buffers or RAM storage. Clustering reduces the quantity of non-scalar data, thereby reducing the quantity of FIFO buffers and/or RAMs in the circuit. For-loops require control logic to keep track of iterations; clustering reduces the number of for-loops, and thereby reduces the amount of control logic. Reducing the quantity of for-loops decreases the latency of the resulting circuit, even as compared to an implementation in which execution of the for-loops can be overlapped. By combining several for-loops into a single for-loop, the HLS tool can optimize the body of a single for-loop as a unit rather than individually optimizing the bodies of the individual for-loops, which leads to improved QoR.

At block 112, configuration data is generated from the HLL function for implementing a circuit from the circuit design. For example, place-and-route and bitstream generation tools may be executed to generate configuration data for manufacturing an ASIC or for programming an FPGA. At block 114, a circuit can be made from the configuration data. The configuration data can be used to manufacture an application-specific integrated circuit (ASIC) or configure a programmable integrated circuit having field programmable gate array (FPGA) circuitry.

Figure 6:
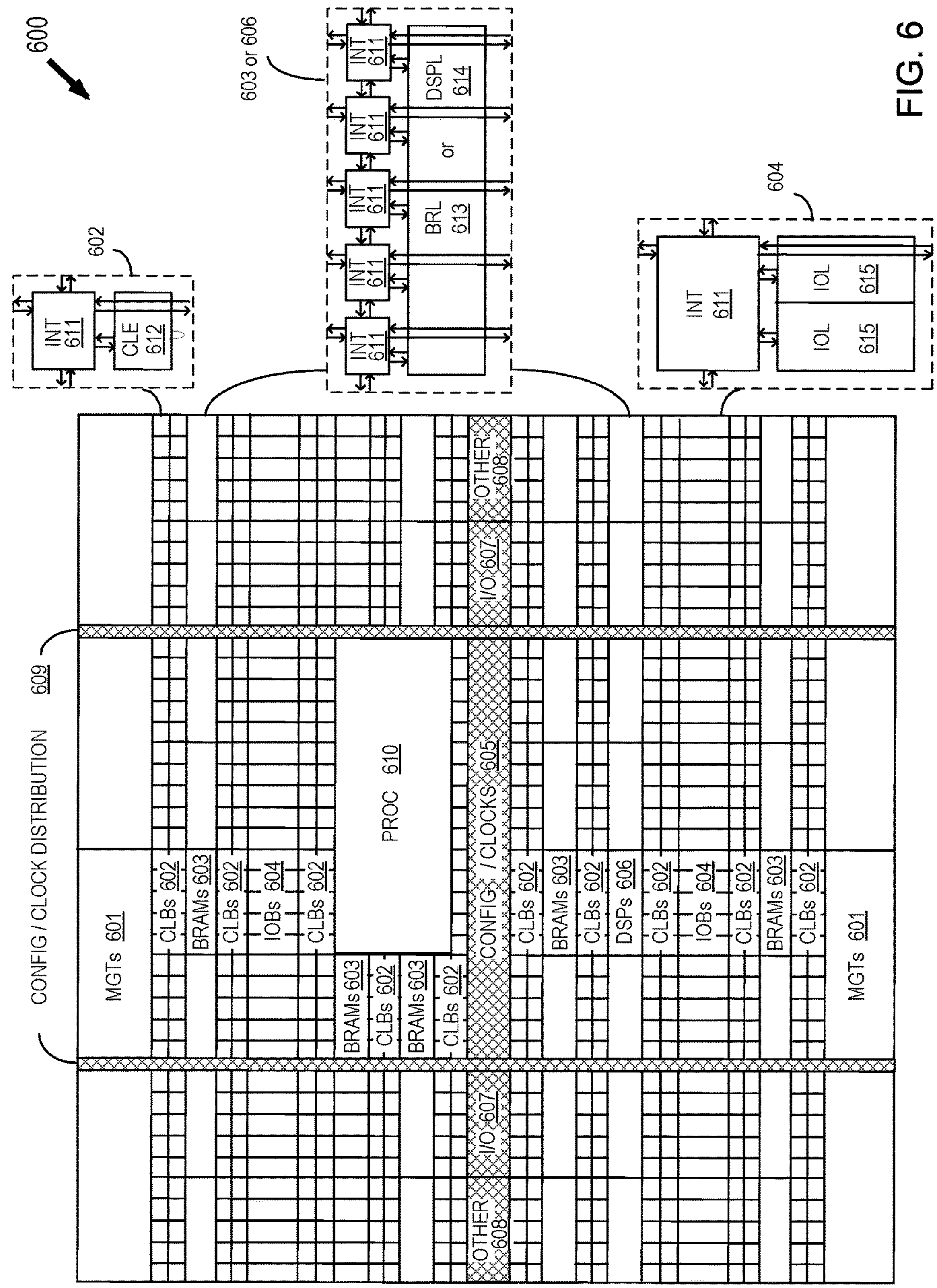
FIG. 6 shows an FPGA implementation of a programmable integrated circuit (IC)

FIG. 6 shows a programmable integrated circuit (IC) 600 on which circuits implemented according to the approaches described herein can be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element (CLE) 612 that can be programmed to implement user logic, plus a single INT 611. A BRAM 603 can include a BRAM logic element (BRL) 613 in addition to one or more programmable interconnect elements. Typically, the number of interconnect elements included in a tile depends on the height of the tile. In the illustrated circuit, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 616 in addition to one instance of the INT 611. As will be clear to those of skill in the art, the actual I/O bond pads connected, for example, to the IOL 616, are manufactured using metal layered above the various illustrated logic blocks, and typically are not confined to the area of the IOL 616.

A columnar area near the center of the die (shown shaded in FIG. 6) is used for configuration, clock, and other control logic. Horizontal areas 609 extending from this column are used to distribute the clocks and configuration signals across the breadth of the programmable IC. Note that the references to “columnar” and “horizontal” areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

Figure 7:
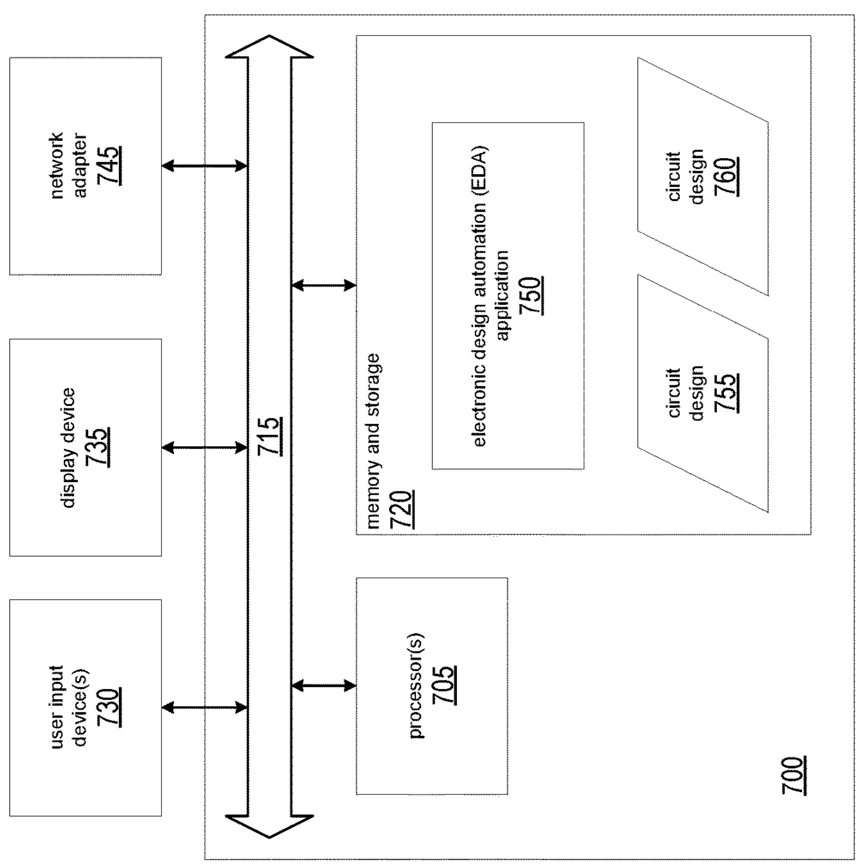
FIG. 7 shows a block diagram illustrating an exemplary data processing system.

FIG. 7 shows a block diagram illustrating an exemplary data processing system (system) 700. System 700 is an example of an EDA system. As pictured, system 700 includes at least one processor circuit (or “processor”), e.g., a central processing unit (CPU) 705 coupled to memory and storage arrangement 720 through a system bus 715 or other suitable circuitry. System 700 stores program code and circuit design 755 within memory and storage arrangement 720. Processor 705 executes the program code accessed from the memory and storage arrangement 720 via system bus 715. In one aspect, system 700 is implemented as a computer or other data processing system that is suitable for storing and/or executing program code. It should be appreciated, however, that system 700 can be implemented in the form of any system including a processor and memory that is capable of performing the functions described within this disclosure.

Memory and storage arrangement 720 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 700 may also include one or more cache memories (not shown) that provide temporary storage of at least some program code and data in order to reduce the number of times program code and data must be retrieved from local memory and persistent storage during execution.

Input/output (I/O) devices such as user input device(s) 730 and a display device 735 may be optionally coupled to system 700. The I/O devices may be coupled to system 700 either directly or through intervening I/O controllers. A network adapter 745 also can be coupled to system 700 in order to couple system 700 to other systems, computer systems, remote printers, and/or remote storage devices through intervening private or public networks. Modems, cable modems, Ethernet cards, and wireless transceivers are examples of different types of network adapter 745 that can be used with system 700.

Memory and storage arrangement 720 may store an EDA application 750. EDA application 750, being implemented in the form of executable program code, is executed by processor(s) 705. As such, EDA application 750 is considered part of system 700. System 700, while executing EDA application 750, receives and operates on circuit design 100. In one aspect, system 700 performs a design flow on circuit design 100, and the design flow may include synthesis, mapping, placement, routing, and the application of the techniques as described herein. System 700 generates an optimized, or modified, version of circuit design 755 as circuit design 760. Circuit design 755 can be analogous to circuit designs represented by HLL code generated from a dependency graph, such as that illustrated in FIG. 3. Circuit design 760 can be analogous to circuit designs represented by a HLL generated from a clustered dependency graph, such as that illustrated in FIGS. 4 and 5.

EDA application 750, circuit design 755, circuit design 760, and any data items used, generated, and/or operated upon by EDA application 750 are functional data structures that impart functionality when employed as part of system 700 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The disclosed methods and system are thought to be applicable to a variety of systems for preparing and/or maintaining circuit designs. Other aspects and features will be apparent to those skilled in the art from consideration of the specification. It is intended that the specification and drawings be considered as examples only, with a true scope of the invention being indicated by the following claims.

What is claimed is:

1. A method comprising:

inputting a block diagram representation of a circuit design to a computer processor;

determining, by the computer processor, respective high-level programming language (HLL) code fragments associated with each block of the block diagram representation;

generating, by the computer processor, a dependency graph from the block diagram representation, wherein the dependency graph includes a plurality of vertices connected by edges, each vertex represents a block of the block diagram representation, and each edge represents a signal that is driven by one block to another block;

generating, by the computer processor, one or more clusters of vertices from the dependency graph, wherein each of the HLL code fragments represented by the vertices of each cluster includes a for-loop, and each cluster includes a subset of the plurality of vertices and edges;

combining, by the computer processor and for each of the clusters, a plurality of for-loops of the HLL code fragments associated with blocks represented by the vertices of the cluster, into a single for-loop; and generating, by the computer processor, an HLL function from each single for-loop and the HLL code fragments associated with each block that is not represented by any of the one or more clusters.

2. The method of claim 1, wherein generating the one or more clusters of vertices includes:

for each first vertex connected to a second vertex by an edge in the dependency graph, determining whether the first vertex and the second vertex satisfy cluster constraints; and in response to determining that the first vertex and the second vertex satisfy the cluster constraints, including the first vertex and the second vertex in a cluster.

3. The method of claim 2, wherein determining whether the second vertex satisfies the cluster constraints includes:

determining whether or not including the second vertex and the first vertex in a cluster introduces a combinational cycle; and in response to determining that including the second vertex and the first vertex introduces a combinational cycle, excluding the second vertex from the cluster.

4. The method of claim 2, wherein determining whether or not the second vertex satisfies the cluster constraints includes:

determining whether or not a block represented by the second vertex operates on non-scalar data of a same length or matrices of same dimensions; and in response to determining the block operates on non-scalar data of a same length or matrices of same dimensions, identifying the second vertex as satisfying the cluster constraint.

5. The method of claim 2, wherein determining whether or not the second vertex satisfies the cluster constraints includes:

determining whether or not an $i^{th}$ element of an output of a block represented by the second vertex is a function only of an $i^{th}$ element of an input of the block; and in response to determining the $i^{th}$ element of the output of the block is a function only of the $i^{th}$ element of the input of the block, identifying the second vertex as satisfying the cluster constraint.

6. The method of claim 1, wherein combining the plurality of for-loops for each of the clusters includes:

sorting the vertices of the cluster in a topological order, beginning with a vertex in the cluster connected by an edge from a vertex outside the cluster;

declaring in the HLL function, scalar variables corresponding to non-scalar signals between blocks represented by the vertices of the cluster; and specifying in the single for-loop, HLL statements that operate on the scalar variables, wherein the HLL statements are functionally equivalent to functions of the plurality of for-loops and are specified in an order that corresponds to the topological order.

7. The method of claim 6, wherein generating the HLL function includes:

declaring arguments to the HLL function, wherein the arguments correspond to an input and an output of the block diagram representation, respectively;

declaring in the HLL function, variables that correspond to signals between blocks not represented by vertices in any of the one or more clusters; and specifying in the HLL function, code fragments associated with each block that is not represented by a vertex in any of the one or more clusters.

8. The method of claim 1, further comprising generating a first clustered dependency graph from the dependency graph to generate one of the clusters of vertices by:

determining whether a first vertex and a second vertex connected to the first vertex by an edge in the dependency graph satisfy cluster constraints; and in response to determining that the first vertex and the second vertex satisfy the cluster constraints:

excluding an edge connecting the second vertex to a third vertex in the dependency graph from the first clustered dependency graph;

adding an edge connecting the first vertex to the third vertex in the first clustered dependency graph; and excluding the second vertex from the first clustered dependency graph, wherein the first vertex represents the cluster of vertices including the first and third vertices.

9. The method of claim 8, further comprising generating a second clustered dependency graph from the first clustered dependency graph to generate the one of the clusters of vertices by:

determining whether the first vertex and a fourth vertex connected to the first vertex by an edge in the first clustered dependency graph satisfy the cluster constraints; and in response to determining that the first vertex and the fourth vertex satisfy the cluster constraints:

excluding an edge connecting the fourth vertex to a fifth vertex in the first clustered dependency graph from the second clustered dependency graph;

adding an edge connecting the first vertex to the fifth vertex in the second clustered dependency graph; and excluding the fourth vertex from the second clustered dependency graph, wherein the first vertex represents the cluster of vertices including the first, third, and fourth vertices.

10. The method of claim 1, further comprising:

generating, by the computer processor, configuration data from the HLL function; and making an integrated circuit from the configuration data.

11. A system, comprising:

a processor; and a memory configured with instructions that when executed by the processor cause the processor to perform operations including:

inputting a block diagram representation of a circuit design to the processor;

determining respective high-level programming language (HLL) code fragments associated with each block of the block diagram representation;

generating a dependency graph from the block diagram representation, wherein the dependency graph includes a plurality of vertices connected by edges, each vertex represents a block of the block diagram representation, and each edge represents a signal that is driven by one block to another block;

generating one or more clusters of vertices from the dependency graph, wherein each of the HLL code fragments represented by the vertices of each cluster includes a for-loop, and each cluster includes a subset of the plurality of vertices and edges;

combining, for each of the clusters, a plurality of for-loops of the HLL code fragments associated with blocks represented by the vertices of the cluster, into a single for-loop; and generating an HLL function from each single for-loop and the HLL code fragments associated with each block that is not represented by any of the one or more clusters.

12. The system of claim 11, wherein the memory is configured with instructions that when executed by the processor cause the processor to generate a cluster of vertices by:

determining, for each first vertex connected to a second vertex by an edge in the dependency graph, whether the first vertex and the second vertex satisfy cluster constraints; and including, in response to determining that the first vertex and the second vertex satisfy the cluster constraints, the first vertex and the second vertex in a cluster.

13. The system of claim 12, wherein the memory is configured with instructions that when executed by the processor cause the processor to determine whether or not the second vertex satisfies the cluster constraints by:

determining whether or not including the second vertex and the first vertex in a cluster introduces a combinational cycle; and excluding, in response to determining that including the second vertex and the first vertex introduces a combinational cycle, the second vertex from the cluster.

14. The system of claim 12, wherein the memory is configured with instructions that when executed by the processor cause the processor to determine whether or not the second vertex satisfies the cluster constraints by:

determining whether or not a block represented by the second vertex operates on non-scalar data of a same length or matrices of same dimensions; and identifying, in response to determining the block operates on non-scalar data of a same length or matrices of same dimensions, the second vertex as satisfying the cluster constraint.

15. The system of claim 12, wherein the memory is configured with instructions that when executed by the processor cause the processor to determine whether or not the second vertex satisfies the cluster constraints by:

determining whether or not an $i^{th}$ element of an output of a block represented by the second vertex is a function only of an $i^{th}$ element of an input of the block; and identifying, in response to determining the $i^{th}$ element of the output of the block is a function only of the $i^{th}$ element of the input of the block, the second vertex as satisfying the cluster constraint.

16. The system of claim 12, wherein the memory is configured with instructions that when executed by the processor cause the processor to combine the plurality of for-loops for each of the clusters by:

sorting the vertices of the cluster in a topological order, beginning with a vertex in the cluster connected by an edge from a vertex outside the cluster;

declaring in the HLL function, scalar variables corresponding to non-scalar signals between blocks represented by the vertices of the cluster; and specifying in the single for-loop, HLL statements that operate on the scalar variables, wherein the HLL statements are functionally equivalent to functions of the plurality of for-loops and are specified in an order that corresponds to the topological order.

17. The system of claim 16, wherein the memory is configured with instructions that when executed by the processor cause the processor to generate the HLL function by:

declaring arguments to the HLL function, wherein the arguments correspond to an input and an output of the block diagram representation, respectively;

declaring in the HLL function, variables that correspond to signals between blocks not represented by vertices in any of the one or more clusters; and specifying in the HLL function, code fragments associated with each block that is not represented by a vertex in any of the one or more clusters.

18. The system of claim 11, wherein the memory is configured with instructions that when executed by the processor cause the processor to generate a first clustered dependency graph from the dependency graph to generate one of the clusters of vertices by:

determining whether a first vertex and a second vertex connected to the first vertex by an edge in the dependency graph satisfy cluster constraints; and in response to determining that the first vertex and the second vertex satisfy the cluster constraints:

excluding an edge connecting the second vertex to a third vertex in the dependency graph from the first clustered dependency graph;

adding an edge connecting the first vertex to the third vertex in the first clustered dependency graph; and excluding the second vertex from the first clustered dependency graph, wherein the first vertex represents the cluster of vertices including the first and third vertices.

19. The system of claim 18, wherein the memory is configured with instructions that when executed by the processor cause the processor to generate a second clustered dependency graph from the first clustered dependency graph to generate the one of the clusters of vertices by:

determining whether the first vertex and a fourth vertex connected to the first vertex by an edge in the first clustered dependency graph satisfy the cluster constraints; and in response to determining that the first vertex and the fourth vertex satisfy the cluster constraints:

excluding an edge connecting the fourth vertex to a fifth vertex in the first clustered dependency graph from the second clustered dependency graph;

adding an edge connecting the first vertex to the fifth vertex in the second clustered dependency graph; and excluding the fourth vertex from the second clustered dependency graph, wherein the first vertex represents the cluster of vertices including the first, third, and fourth vertices.

20. The system of claim 11, wherein the memory is further configured with instructions that when executed by the processor cause the processor to:

generate configuration data from the HLL function; and make an integrated circuit from the configuration data.

* * * * *